US007961466B2

(12) United States Patent
Eriksson

(10) Patent No.: US 7,961,466 B2
(45) Date of Patent: Jun. 14, 2011

(54) HIGH VOLTAGE BUSHING, A METHOD OF COOLING A CONDUCTOR THEREOF, AND AN ELECTRIC POWER DISTRIBUTION SYSTEM COMPRISING SUCH A BUSHING

(75) Inventor: Thomas Eriksson, Ludvika (SE)

(73) Assignee: ABB Technology Ltd. (CH)

( * ) Notice: Subject to any disclaimer, the term of this patent is extended or adjusted under 35 U.S.C. 154(b) by 0 days.

(21) Appl. No.: 12/797,739

(22) Filed: Jun. 10, 2010

(65) Prior Publication Data

US 2010/0243288 A1 Sep. 30, 2010

Related U.S. Application Data

(63) Continuation of application No. PCT/EP2008/067015, filed on Dec. 8, 2008.

(30) Foreign Application Priority Data

Dec. 21, 2007 (EP) .................................... 07123918

(51) Int. Cl.
*H05K 7/20* (2006.01)

(52) U.S. Cl. ....... 361/699; 361/688; 361/689; 174/15.1; 174/15.3

(58) Field of Classification Search ........................ None
See application file for complete search history.

(56) References Cited

U.S. PATENT DOCUMENTS

| | | | | |
|---|---|---|---|---|
| 3,716,652 | A * | 2/1973 | Lusk et al. | 174/15.3 |
| 3,883,680 | A * | 5/1975 | Keen, Jr. | 174/12 BH |
| 4,358,631 | A | 11/1982 | Matsuda | |
| 5,214,240 | A * | 5/1993 | McArdle | 174/11 BH |
| 5,466,891 | A * | 11/1995 | Freeman et al. | 174/142 |
| 2009/0126965 | A1* | 5/2009 | Astrom et al. | 174/15.3 |
| 2010/0051306 | A1* | 3/2010 | Tornkvist et al. | 174/15.3 |

FOREIGN PATENT DOCUMENTS

WO 2007078238 A1 7/2007

OTHER PUBLICATIONS

International Preliminary Report on Patentability; PCT/EP2008/067015; Mar. 1, 2010; 9 pages.
International Search Report and Written Opinion of the International Searching Authority; PCT/EP2008/067015; Jun. 30, 2009; 8 pages.
European Search Report; Application No. EP 07 12 3918; May 20, 2008; 4 pages.

* cited by examiner

*Primary Examiner* — Boris L Chervinsky
(74) *Attorney, Agent, or Firm* — St. Onge Steward Johnston & Reens LLC

(57) ABSTRACT

A high voltage bushing including an elongated electric conductor, a tubular insulator surrounding the conductor, and cooling mechanism for cooling the conductor. The cooling mechanism includes at least one cooling element extending along a fraction of the length of the conductor and in thermal connection with the conductor.

20 Claims, 2 Drawing Sheets

HIGH VOLTAGE BUSHING, A METHOD OF COOLING A CONDUCTOR THEREOF, AND AN ELECTRIC POWER DISTRIBUTION SYSTEM COMPRISING SUCH A BUSHING

CROSS-REFERENCE TO RELATED APPLICATIONS

The present application is a continuation of pending International patent application PCT/EP2008/067015 filed on Dec. 8, 2008, which designates the United States and claims priority from European patent application number 07123918.0 filed on Dec. 21, 2007, the content of which is incorporated herein by reference.

FIELD OF THE INVENTION

The present invention relates to a high voltage bushing comprising an elongated electric conductor, a tubular insulator surrounding said conductor, and cooling means for cooling said conductor.

The invention also relates to a method of cooling a conductor of such a bushing, and an electric power distribution system comprising such a bushing.

High voltage is referred to as voltages above 1 kV. However, the design of the bushing of the invention will contribute to making the latter particularly suitable for very high voltages, preferably from 300 kV and above.

Typically, but not necessarily, the bushing of the invention is of a considerable length and the electric conductor thereof is supported by the insulator only in positions remote from each other, such that the conductor will be extending free and unsupported over a considerable length thereof. Typically, the conductor is only mounted to the insulator in the end regions thereof, i.e. the end regions of the bushing. Between said mounting regions, the insulator typically forms a shell around the conductor, with a gas-filled space being defined between the inner periphery of the insulator and the outer periphery of the conductor.

BACKGROUND OF THE INVENTION

Ultra high voltage bushings of prior art comprise an electric conductor made of a hollow aluminum tube. Said tube has a large cross-section in order to reduce electric losses during operation, when an electric current is conducted through the conductor. The conductor is surrounded by an insulator, and a gas-filled space is provided between the inner periphery of the insulator and the conductor. In the opposite ends of the bushing, the conductor is mounted in and supported by the insulator. The gas in said space is, preferably, an electrically insulating inert gas such as $SF_6$, and said space is therefore, preferably, gas-sealed. The conductor should have a relatively large outer diameter in order to permit the insulating gas to absorb heat from the conductor, and for the purpose of providing a sufficiently high rigidity of the conductor. It is a design challenge to make the conductor able of coping with elevated mechanical loads, such as those appearing in connection to, for example, an earth quake or any other seismic phenomena, and still being able of carrying high voltages.

Bushings of prior art are well suited for their purpose as long as the electric current to be conducted by the conductor is at a moderate level, i.e. those levels encountered by corresponding bushings in contemporary electric power installations. However, if the electric current is increased, which will most probably be the case in future applications, there will be spots along the length of the conductor where the cooling thereof by the surrounding gas or any other surrounding media is insufficient, thereby resulting in increased losses.

In bushings provided with a condenser of solid material in the space between the inner periphery of the insulator and the conductor there has been suggested to cool the conductor by means of circulation of a liquid such as water in the central channel of the conductor. However, such a solution will add considerable weight, caused by the liquid, to the bushing. In some bushings this is fully acceptable, but in other bushings, such as those in which there is no supporting condenser, it will be unacceptable, since it will make the load on the conductor to large. Accordingly, the conductor will become less able of standing the test of seismic abnormalities.

SUMMARY OF THE INVENTION

It is an object of the present invention to provide for a sufficient cooling of an electric high voltage bushing without increasing the load on the conductor thereof too much. It is also an object of the invention to provide a bushing with a capability of conducting increased levels of electric current without being overheated, and without adding so much weight to the bushing that its ability of absorbing elevated mechanical loads, such as those caused by seismic disturbances, becomes insufficient.

The object of the invention is achieved by means of initially defined bushing, characterized in that said cooling means comprises at least one cooling element extending along a fraction of the length of said conductor and in thermal connection with said conductor. Thereby, local cooling of regions of the conductor that are more prone to heating can be performed, without the necessity of filling the whole length of any central channel or other longitudinal channel of the bushing with a liquid that will add a considerable weight to be carried by the conductor.

According to a preferred embodiment said cooling element is in thermal contact with a heat absorbing medium. Such a medium may include a gas or a liquid. As an alternative of self being the element via which heat from the conductor is conducted to said medium, the cooling element might only define a space within which a cooling medium is permitted to be in direct contact with the conductor material, whereby heat is conducted directly from the conductor to the cooling medium.

Preferably, said conductor is tubular with a longitudinal channel extending through it, and that said cooling element is arranged in said channel. Preferably, the longitudinal channel is a central channel of the conductor. By providing the cooling element inside said channel, the cooling element will disturb the electric field outside the conductor less and will also be less subjected thereto. The positioning of the cooling element inside said channel also provides for advantageous solutions with regard to any circulation of a cooling medium to and from the cooling element, since such circulation may then be carried out within said channel.

Preferably, said cooling element is in direct contact with the conductor. This feature is particularly relevant in those cases when the cooling element is defined by a body adapted to absorb heat and/or conduct heat to a cooling medium, since it will improve the absorbing and/or conducting of heat by the cooling element. It might also be an important feature in cases when the cooling element comprises one or more parts that are arranged so as to define a closed, sealed space into which a cooling medium is to be introduced in order to get into direct contact with the conductor. Typically such an embodiment includes that the cooling element be formed by two opposite plugs arranged at a distance from each other, corresponding to said fraction of the conductor length, and defining a small space between them into which a cooling medium may be introduced in order to absorb heat directly from the conductor.

According to one embodiment, said cooling element defines a closed space with an opening for introduction of a cooling medium into said space. Preferably, said cooling element also has a second opening for the discharge of a cooling medium from said space. Thereby, cycling of a cooling medium into and out of the cooling element is permitted and a continuous cooling of the conductor may be achieved. In fact such a continuous cycling is also preferred during operative conditions.

According to a preferred embodiment, said cooling element comprises a tubular body. Preferably the tubular body has end walls, preferably integrated with the mantle, thereby defining a closed space through which a cooling medium may be circulated. Checking the tightness of such a body will be a relatively easy operation, and the risk of having leakages of cooling medium out of the element and into the conductor channel will be reduced. This design also promotes a relatively light-weight, thin-walled element that does not in itself add so much weight to carried by the conductor.

Preferably, said conductor is tubular with a longitudinal channel extending through it, wherein said tubular body has an outer mantle surface which is in supporting and thermal connection with an inner periphery of said conductor. Thereby, a direct thermal connection between the cooling element and the conductor is achieved. Moreover, the positioning and fixation of the cooling element inside the conductor channel might be facilitated. For example the tubular cooling element may be introduced into the conductor channel and connected attached to the inner periphery thereof by means of induction welding from outside the conductor, or a pressure applied inside the tubular cooling element may be used to press the mantle wall thereof against the inner periphery of the conductor. Such pressure may be a pressure generated by means of a spring element arranged in the cooling element or the pressure generated by the cooling medium itself.

According to a preferred embodiment, said cooling element comprises a body of metal in thermal connection with said conductor. A metal will have the advantage of being a good heat conductor. However, alternative embodiments may include the use of other materials in the cooling element. For example, in the case when the cooling element is defined by opposite plugs defining a space in which the cooling medium is supposed to be in direct contact with the inner periphery of the conductor, and the plugs themselves do not play a vital part as a heat conductor, any suitable, preferably light, material such as a polymer or a ceramic may constitute at least a part of said plugs.

According to one embodiment, the bushing comprises a first conduit extending from an opening of the bushing to a cooling medium inlet opening of said at least one cooling element. Preferably, said conductor is tubular with a longitudinal channel extending through it, wherein said conduit extends inside said longitudinal channel. Preferably, the bushing also comprises a second conduit extending from an opening of the bushing to a cooling medium outlet opening of said cooling element. Preferably, also said second conduit extends inside said longitudinal channel.

According to a preferred embodiment, each of said first and second conduits is formed by a hose or pipe separate from the conductor and extending inside said channel of the latter. The volume of the channels defined by said conduits inside said channel should be substantially less than the volume of the channel. Thereby, the weight gain compared to the case in which the cooling medium is permitted to flow through and fill the whole conductor channel is considerable, and only as much cooling medium as needed for the purpose of performing the cooling of the cooling elements may be used. In other words, the channel of the conductor may be optimized with regard to the functional requirements of the conductor, while the volume of the conduits for supplying the cooling medium the cooling element or elements may be optimized with regard to the needed cooling effect, and the use of excessive amounts of cooling medium, increasing the load on the conductor, is avoided.

As a further aspect, it is preferred that the conduits extending in the longitudinal channel of the conductor have a different own frequency than the conductor itself or be arranged so as to counteract any motion of the conductor by having a dampening effect on the motions of the latter.

Preferably, said cooling element is located at a first end region of the bushing. The invention includes bushings in which an electrically insulating gas is housed in a space between the inner periphery of the insulator and the outer periphery of the conductor. In such bushings the gas will be absorb heat from the conductor and act as a cooling medium. However, in the end regions, and in particular in an upper end region in those cases when the bushing extends in a sloping, non-horizontal direction, hot gas is gathered and the cooling of the conductor becomes insufficient. Therefore, according to the invention, it is suggested that a cooling element be positioned in that end region.

Preferably, the bushing also comprises a second cooling element located at a second end region of the bushing, since also the opposite end, or lower end, is likely to suffer from insufficient cooling.

According to the invention, the bushing comprises a plurality of discrete cooling elements arranged at separate locations along the length of the conductor. In fact the invention suggests the provision of a cooling element at any site or fraction of the length of the conductor at which the normal cooling effect is insufficient and less than that of neighboring sites or fractions.

Preferably, the bushing is provided with connection means for the connection thereof to a cooling system by means of which a circulating and heat absorbing cooling medium is thermally connected to said at least one cooling element upon operation of the bushing. Preferably, said connection means include any connection element or coupling between said first and second conduits and said cooling system. The cooling system may be a separate cooling system for the bushing or be any other cooling system, such as the cooling system of a HVDC valve. It should be understood that, preferably, the bushing extends through a wall of a HVDC valve hall, wherein a lower end of the bushing is located in the valve hall and an upper end of the bushing is located outside the valve hall. The cooling system connected to and arranged so as to supply the cooling elements or elements of the bushing with a cooling medium is, preferably positioned inside said valve hall.

Preferably said cooling medium comprises a liquid, preferably water.

It should be understood that, preferably, the conductor is mounted in opposite ends of the insulator, and that there is provided a gas-filled space between the inner periphery of the insulator and the outer periphery of the conductor along the latter between said ends.

The object of the invention is also achieved by means of the initially defined method, characterized in that the conductor is locally cooled along a fraction of the length thereof.

Said method also includes that the conductor is locally cooled in a first end region thereof in said bushing, and, preferably, that the conductor is also locally cooled in a second end region thereof in said bushing.

Preferably, the conductor is cooled by means of circulating a cooling medium to a thermal contact with a cooling element provided at said fraction of the length of the conductor. The use of the expression thermal contact suggests that the cooling medium need not be introduced into the cooling element, but that it may only affect the cooling element from the outside thereof. However, as has been described earlier, embodiments in which a cooling medium is actually introduced into a cooling element might be preferred.

The invention also relates to an electrical power distribution system, characterized in that it comprises a bushing according to the invention. Such an electric power distribution system may be characterized in that, in its operational position in said system, the bushing extends with its longitudinal direction in a direction other than vertical, and typically also other than a horizontal direction. Preferably, the bushing penetrates a grounded wall, such as the wall of a thyristor valve hall, and is connected to a thyristor valve inside said hall and to a power distribution line or cable at the outside thereof.

Further features and advantages of the present invention will be presented in the following detailed description of a preferred embodiment and in the annexed patent claims.

BRIEF DESCRIPTION OF THE DRAWINGS

A preferred embodiment of the invention will now be explained more in detail with reference to the annexed drawing, on which.

DETAILED DESCRIPTION OF THE INVENTION

Figure 1:
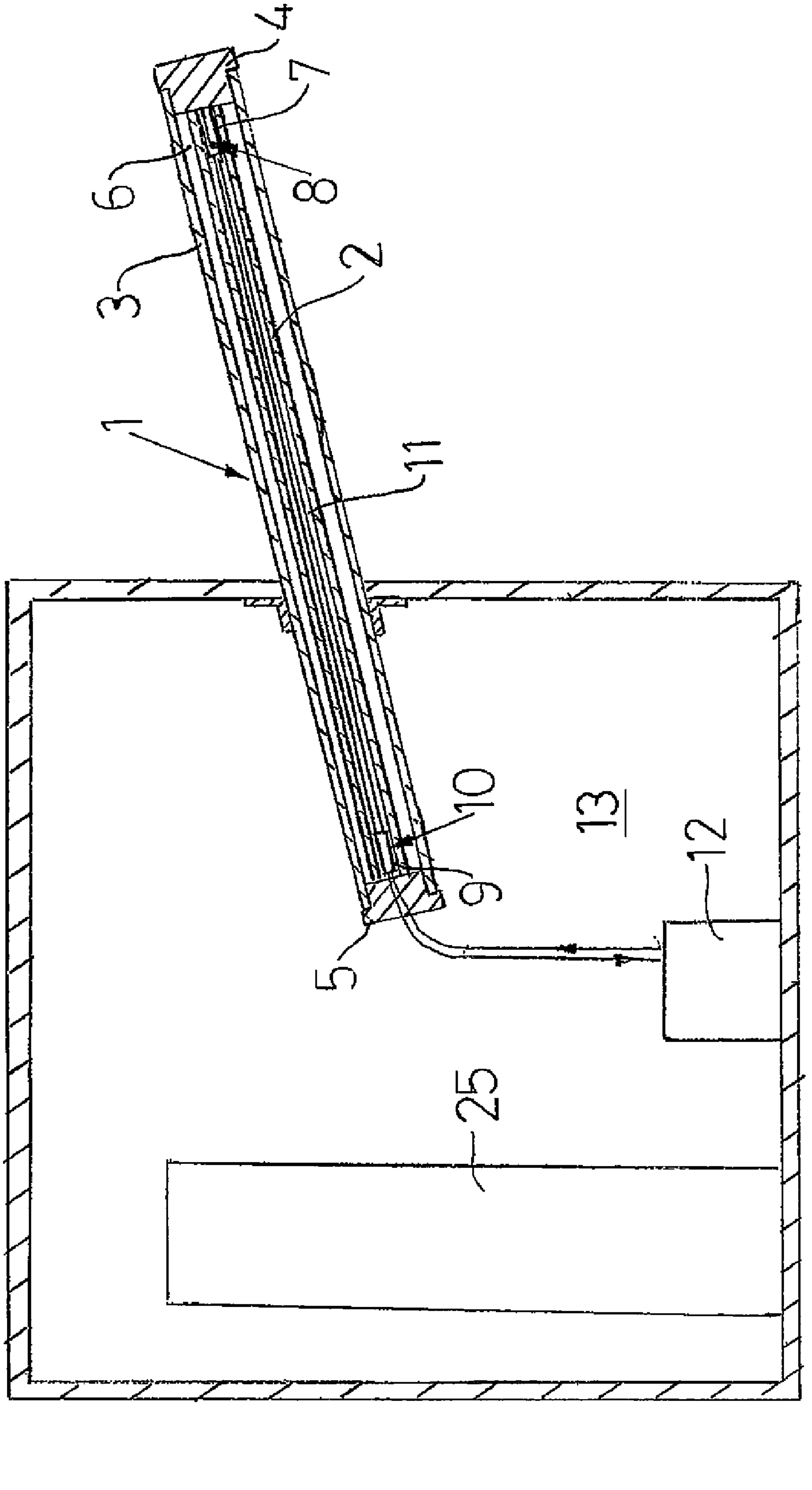
FIG. 1 is a cross-section of a bushing according to the invention provided in a transmission station.

FIG. 1 shows a bushing 1 according to the invention. The bushing is an UHVDC wall bushing, which is a bushing adapted for use in power distribution systems operating with very high voltages, i.e. above 300 kV and even up to 800 kV (and the voltages will probably increase even further in the future). The bushing 1 is of a very long (in the range of 10-20 meters) and slender type, which in its operative position is supposed to extend in a direction other than vertical, and preferably also other than horizontal. Thereby, there will be certain requirements on the ability of the bushing 1 and individual parts thereof to carry its own weight and the bending forces induced by the latter, not only under normal circumstances but also under exceptional circumstances such as seismic disturbances. Therefore, the bushing 1 and separate parts thereof should have a rather high strength/weight ratio or stiffness/weight ratio.

The bushing 1 comprises an elongated tubular conductor 2 and an elongated tubular insulator 3 that encloses the conductor 2. In opposite ends 4, 5 of the insulator, the conductor 2 is mounted in and supported by the insulator 3. The conductor 2 is, preferably, mainly constituted by a light weight material of high electric conductibility and high mechanical strength, such as aluminum or, more precisely, an aluminum alloy, preferably formed through an extruding process. The insulator 3 is, preferably, mainly constituted by a light weight, non-brittle material, electrically insulating material such as a polymer. However, the insulator 3 may also comprise a layer of semiconducting material or electric field-grading material. In this context it should be mentioned that the bushing 1 preferably also comprises further parts known per se as being essential for a good functionality of the bushing, such as shield or screen. The insulator 3 may comprise sheds, as known per se, on the outer periphery thereof, although not shown in the drawing.

Between said opposite ends 4, 5 the conductor extends unsupported, i.e. freely without any supporting element connected thereto. Accordingly, between said opposite ends, there is a space 6 between the inner periphery of the insulator 3 and the outer periphery of the conductor 2. During operation, this space 6 is filled with an inert gas, such as SF6, that, in addition to its electrical insulation function, contributes to the cooling of the conductor 2. During operation, when as a result of the voltage applied thereto and the electric current flowing through it the conductor 2 is heated, the inert gas surrounding the conductor 2 will perform a motion in said space 6, and a cooling of the conductor 2 by means of convection will be achieved. However, in the end regions of the bushing, i.e. in the regions neighboring the opposite ends 4, 5 in which the conductor 2 is mounted in the insulator 3, the motion of the gas is limited, and, accordingly, the cooling effect of the gas is also reduced compared to other regions along the conductor 2.

Accordingly, in order to improve the cooling efficiency in those regions in which the cooling effect of the gas is reduced, a first cooling element 7 is located in a first end region 8 of the conductor 2 inside insulator 3 of the bushing 1, at the first end 4 of the bushing, while a second cooling element 9 is located in a second, opposite end region 10 of conductor 2 inside the insulator 3 of the bushing 1, at the second end 5 of the bushing 1. Each cooling element 7, 9 is arranged inside one and the same longitudinal channel 11 extending through the conductor 2 in the longitudinal direction of the latter. The channel 11 forms a central channel, coaxial with the generally cylindrical wall that defines the tubular conductor 2. Each cooling element 7, 9 is in thermal contact with the conductor 2 in said end regions 8, 10.

Figure 2:
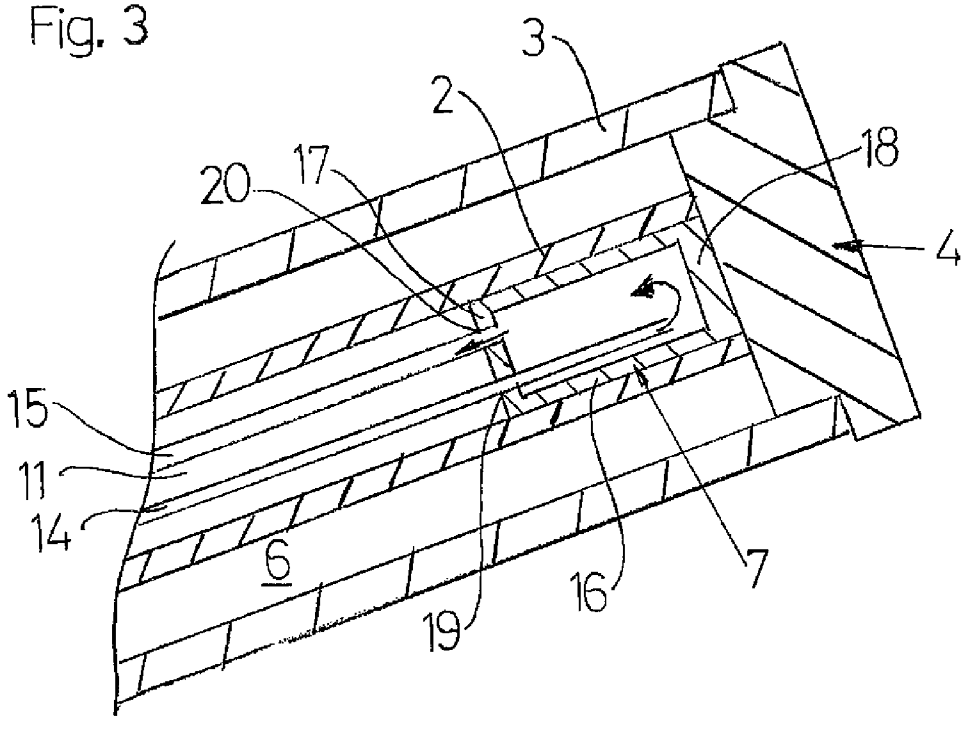
FIG. 2 is a part of a the bushing shown in FIG. 1, in en enlarged scale.

Further, as shown schematically in FIGS. 1 and 2, the bushing 1 is connected to a cooling system, indicated with 12 and arranged to circulate a cooling medium, preferably a liquid, and most preferably water, to and from the cooling elements 7, 9 located in the conductor channel 11. During operation heat will be transferred from the conductor 2 to the cooling medium through the cooling elements 7, 9, thereby resulting in local cooling of the conductor 2 along fractions of its length inside the insulator 3. The cooling system 12 is arranged in a thyristor valve hall, indicated with 13 and schematically shown in FIGS. 1 and 2. A thyristor valve to which the conductor 2 of the bushing 1 is electrically connected is indicated with 25. The specific connection between bushing 1 and thyristor valve 25 is, however, for reasons of clarity, not shown in detail. The bushing 1 extends with sloping angle through a wall of the hall 13, such that a lower end of the bushing 1 is located inside the hall 13 and an upper end is located outside said hall 13. The first end 4 of the bushing 1 forms the upper end, while the second end 5 thereof forms the lower end. The bushing 1 is connected to the cooling system 12 in the lower, second end 5 thereof, and the cooling medium of the cooling system 12 is introduced into the longitudinal channel 11 of the conductor 2 from said second end. Preferably, the cooling medium in the cooling system 12 is electrically non-conducting, and may, for instance comprise deionized water. The cooling system 12 may comprise a deionizer, a pump, a heat exchanger etc. The cooling medium may be at the same electric potential as or at another electric potential than the conductor 2 of the bushing 1. The cooling system 12 may be the cooling system of the thyristor valve 25. Since filling of the channel 11 with liquid cooling medium would result in an unacceptable mass being added to the weight of conductor 2 itself, conduits 14, 15 of substantially less inner diameter than that that of the channel 11 itself, and preferably made of a low-density material, such as a polymer, are arranged inside the channel 11 for the purpose of conducting the cooling medium to the respective cooling element 7, 9 and back out of the bushing 1. Thus, a much smaller volume of cooling medium will be carried by the conductor 2 than if the whole channel 11 was to be filled with said cooling medium.

Figure 3:
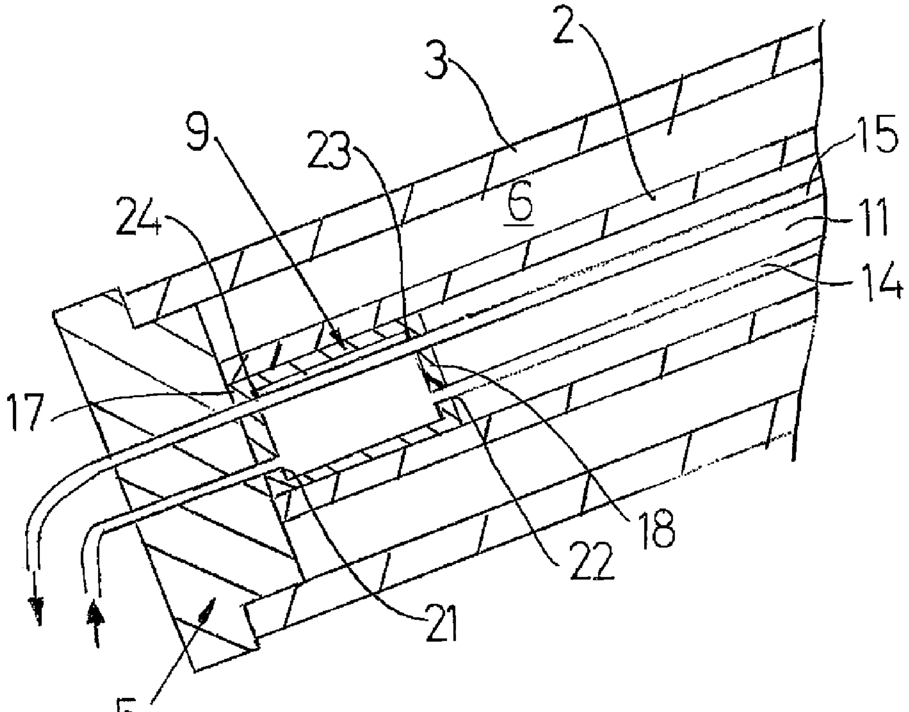
FIG. 3 is another part of the bushing shown in FIG. 1, also in an enlarged scale.

FIGS. 2 and 3 show the respective cooling elements 7, 9. In this embodiment, each of the cooling elements 7, 9 is formed by a hollow body, here a cylindrical body formed by a cylinder 16 and opposite end walls 17, 18 connected to the ends of the cylinder 16. The outer periphery of the cylinder 16 corresponds to the neighboring inner periphery of the surrounding conductor 2, and is in direct contact with the latter along most of its area, preferably along the whole area of the outer periphery of the cylinder 16. Preferably, the cylinder 16, and also the end walls 17, 18, is/are made of an thermally conducting material, preferably a metal. A metal will also be advantageous in that it will possible to attach to the surrounding conductor 2 by means of, for example, induction heating from outside the conductor. Moreover, in other designs than the one of this embodiment, in which the cooling element has a more solid and massive design, a metal may contribute to the conducting of an electric current through the conductor to such a degree that this in itself contributes to less heating of the conductor in the region of the cooling element. It should be understood that the invention, in a general aspect, also includes such solutions. Preferably, the part of the cooling element 7, 9 that is to be attached to or be in direct contact with the conductor 2 comprises a material which is compatible with that of the conductor, i.e. a material that can easily be attached thereto by a melting operation, such as welding or soldering. Preferably, the cooling element 7, 9, or at least the part thereof that is to be in contact with the conductor 2, is made of the same material as the surrounding part of the conductor 2.

FIG. 2 shows the first cooling element 7, which is in an end position in which the cooling medium is not transported further along the channel 11, but instead is returned in the opposite direction. Therefore, a first end wall 17 of the first cooling element 7 is provided with an inlet opening 19 through which a first conduit 14 for supply of cooling medium enters the interior of the cooling element 7. In the same end wall 17 there is also provided an outlet opening connected to the second conduit 15, which is provided for the return of the cooling medium from the first cooling element. In this specific case, when the cooling element defines a space into which the cooling medium is introduced, the conduits 14, 15 end at different positions in said cooling element 7 in the length direction thereof in order to promote a good circulation of the cooling medium therein. Accordingly the first conduit 14 ends adjacent the second end wall 18 while the second conduit 15 end in the region of the first end wall 17 of the cooling element 7.

FIG. 3 shows the second cooling element 9 more in detail. This cooling element is located such that the cooling medium introduced into and permitted to absorb heat from the conductor 2 passes the cooling element 9 and is further conducted along the conductor to any downstream cooling element, i.e. the first cooling element 7 in this embodiment. Therefore, each end wall 17, 18 thereof is provided with two openings, for the conduits 14 and 15 respectively. The supply conduit 14 is connected to a downstream opening 21 in which it ends in order to permit the cooling medium to be injected in the interior space defined by cylinder 16 and the end walls 17, 18 of the second cooling element 9. At an outlet opening 22 in the opposed end wall 18, the conduit 14 continues towards the next downstream cooling element. The return conduit 15, returning heated cooling medium to the cooling system 11, enters a first opening 23 in the second end wall 18, extends through the interior space of the second cooling element 9 and exits said cooling element through a second opening 24 in the first end wall 17 of the cooling element 9.

It should be understood that numerous alternative embodiment within the scope of the invention will be obvious for a person skilled in the art once confronted with the above disclosure of the present invention. For example there might be a plurality of cooling elements along the length of the conductor. The cooling elements of one and the same bushing may be of different design. The cooling elements may be of other designs than the one suggested above. For example, some cooling element may be formed by a solid piece of material only the exterior of which is to be in contact with any cooling medium. Or, said solid piece of material may be provided with channels, and not an open space as described above, through which the cooling medium is permitted to flow. Alternatively, the cooling element is only formed by plugs corresponding to the above end walls, that enclose a space in which the cooling medium is permitted to be in direct contact with the conductor wall. Or, the cooling element is formed by a helical tube wound such that the outer periphery thereof is in connection with the surrounding conductor wall, wherein the cooling medium is conducted through said tube. Depending on how much cooling effect is needed the cooling medium may comprise gas. However the use of a gas will reduce the need of local cooling elements since it likely to be lighter than a liquid cooling medium and therefore may be accepted to fill the entire space of the conductor channel without causing unacceptable load increase on the latter. Thereby, the need of the conduits is reduced. However, a liquid is preferred since it will be easier to handle and is likely to have a much better cooling effect.

What is claimed is:

1. A high voltage bushing extending in a sloping, non-horizontal direction comprising an elongated electric conductor, a tubular insulator surrounding said conductor, and cooling means for cooling said conductor, characterized in that said cooling means comprises one cooling element extending along a fraction of the length of said conductor and in thermal connection with said conductor and said cooling element is located at a first and upper end region of the bushing.

2. A high voltage bushing according to claim 1, characterized in that said cooling element is thermal contact with a heat absorbing medium.

3. A high voltage bushing according to claim 1, characterized in that said conductor is tubular with a longitudinal channel extending through it, and that said cooling element is arranged in channel.

4. A high voltage bushing according to claim 1, characterized in that said cooling element is in direct contact with the conductor.

5. A high voltage bushing, according to claim 1, characterized in that said cooling element defines a closed space with an opening for introduction of a cooling medium into said space.

6. A high voltage bushing according to claim 5, characterized in that said cooling element also has a second opening for the discharge of a cooling medium from said space.

7. A high voltage bushing according to claim 1, characterized in that said cooling element comprises a tubular body.

8. A high voltage bushing according to claim 7, characterized in that said conductor is tubular with a longitudinal channel extending through it, and that said tubular body has an outer mantle surface which is in supporting and thermal connection with an inner periphery of said conductor.

9. A high voltage bushing according to claim 1, characterized in that said cooling element comprises a body of metal in thermal connection with said conductor.

10. A high voltage bushing according to claim 1, characterized in that it comprises a first conduit extending from an opening of the bushing to a cooling medium inlet opening of said at least one cooling element.

11. A high voltage bushing according to claim 10, characterized in that said conductor is tubular with a longitudinal channel extending through it, and that said conduit extends inside said longitudinal channel.

12. A high voltage bushing according to claim 10, characterized in that it comprises a second conduit extending from an opening of the bushing to a cooling medium outlet opening of said cooling element.

13. A high voltage bushing according to claim 12, characterized in that said conductor is tubular with a longitudinal channel extending through it, and that said second conduit extends inside said longitudinal channel.

14. A high voltage bushing according to claim 12, characterized in that each of said first and second conduits is formed by a hose or pipe separate from the conductor and extending inside said channel of the latter.

15. A high voltage bushing according to claim 1, characterized in that it is provided with connection means for the connection thereof to a cooling system by means of which a circulating and heat absorbing cooling medium is thermally connected to said at least one cooling element upon operation of the bushing.

16. A high voltage bushing according to claim 15, characterized in that said cooling medium comprises a liquid.

17. A high voltage bushing according to claim 1, characterized in that the conductor is mounted in opposite ends of the insulator, and that there is provided a gas-filled space between the inner periphery of the insulator and the outer periphery of the conductor along the latter between said ends.

18. A method of cooling a conductor of a high voltage bushing which extends in a sloping, non-horizontal direction, said bushing comprising an elongated electric conductor and a tubular insulator surrounding said conductor, characterized in that the conductor is locally cooled along a fraction of the length thereof at a first and upper end region of the bushing.

19. A method according to claim 18, characterized in that the conductor is cooled by means of circulating a cooling medium to a thermal contact with a cooling element provided at said fraction of the length of the conductor.

20. An electrical power distribution system, characterized in that it comprises a bushing according to claim 1.

* * * * *